(12) United States Patent
Kang

(10) Patent No.: US 9,716,130 B2
(45) Date of Patent: *Jul. 25, 2017

(54) ORGANIC LIGHT-EMITTING DISPLAY APPARATUS AND METHOD OF MANUFACTURING THE SAME

(71) Applicant: Samsung Display Co., Ltd., Yongin-si, Gyeonggi-do (KR)

(72) Inventor: Chang-Min Kang, Yongin-si (KR)

(73) Assignee: Samsung Display Co., Ltd., Gyeonggi-do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 14/932,085

(22) Filed: Nov. 4, 2015

(65) Prior Publication Data
US 2016/0056220 A1    Feb. 25, 2016

Related U.S. Application Data

(63) Continuation of application No. 14/035,051, filed on Sep. 24, 2013, now Pat. No. 9,209,235.

(30) Foreign Application Priority Data

May 30, 2013    (KR) .......................... 10-2013-0062104

(51) Int. Cl.
*H01L 51/52* (2006.01)
*H01L 51/10* (2006.01)
(Continued)

(52) U.S. Cl.
CPC ...... *H01L 27/3246* (2013.01); *H01L 27/3248* (2013.01); *H01L 27/3258* (2013.01);
(Continued)

(58) Field of Classification Search
CPC ............ H01L 27/3246; H01L 27/3262; H01L 29/78675; H01L 27/3258; H01L 29/66757;
(Continued)

(56) References Cited

U.S. PATENT DOCUMENTS 9,209,235 B2 * 12/2015 Kang .................. H01L 27/3262
2007/0262299 A1 * 11/2007 Kho .................... H01L 51/5088
257/40

(Continued)

FOREIGN PATENT DOCUMENTS

KR    10-2005-0110550    11/2005
KR    10-2011-0094460    8/2011
KR    10-2012-0078954    7/2012

*Primary Examiner* — Marcos D Pizarro
*Assistant Examiner* — Nelson Garces
(74) *Attorney, Agent, or Firm* — Knobbe Martens Olson & Bear LLP

(57) ABSTRACT

An organic light-emitting display apparatus includes a substrate; a thin film transistor (TFT) on the substrate; a pixel-defining layer (PDL) disposed on the TFT and comprising a first area having a first thickness and a second area having a second thickness greater than the first thickness, and a via hole in the first area; a pixel electrode disposed on at least a portion of the first area, and electrically connected to the TFT via the via hole; an intermediate layer on the pixel electrode, the intermediate layer comprising an emission layer (EML); and an opposite electrode on the intermediate layer. According to a method of manufacturing the organic light emitting display apparatus, the PDL is formed on the substrate and then the pixel electrode is formed on the first area.

20 Claims, 6 Drawing Sheets

(51) Int. Cl.
*H01L 29/00* (2006.01)
*H01L 29/08* (2006.01)
*H01L 33/00* (2010.01)
*H01L 51/50* (2006.01)
*H01L 51/56* (2006.01)
*H01L 29/786* (2006.01)
*H01L 27/32* (2006.01)
*H01L 29/66* (2006.01)

(52) U.S. Cl.
CPC ...... *H01L 27/3262* (2013.01); *H01L 27/3276* (2013.01); *H01L 29/66757* (2013.01); *H01L 29/78675* (2013.01); *H01L 51/56* (2013.01); *H01L 2227/323* (2013.01); *H01L 2251/533* (2013.01); *H01L 2251/558* (2013.01)

(58) Field of Classification Search
CPC . H01L 27/3248; H01L 51/56; H01L 27/3276; H01L 2227/323; H01L 2251/533; H01L 2251/558

USPC ..................................................... 257/35–45
See application file for complete search history.

(56) References Cited

U.S. PATENT DOCUMENTS

| | | | |
|---|---|---|---|
| 2008/0246029 A1* | 10/2008 | Kang | ...................... H01L 27/12 257/40 |
| 2010/0171107 A1* | 7/2010 | Jung | ...................... H01L 27/322 257/40 |
| 2011/0198596 A1 | 8/2011 | Park | |
| 2012/0169217 A1 | 7/2012 | Kim et al. | |
| 2013/0092972 A1* | 4/2013 | Kim | ...................... H01L 51/5256 257/100 |
| 2013/0099258 A1* | 4/2013 | Lim | ...................... H01L 51/5209 257/88 |
| 2014/0159022 A1* | 6/2014 | Song | ...................... H01L 27/3248 257/40 |

\* cited by examiner

ORGANIC LIGHT-EMITTING DISPLAY APPARATUS AND METHOD OF MANUFACTURING THE SAME

CROSS-REFERENCE TO RELATED PATENT APPLICATION

This application is a continuation of U.S. application Ser. No. 14/035,051 filed Sep. 24, 2013, which claims the benefit of Korean Patent Application No. 10-2013-0062104, filed on May 30, 2013, in the Korean Intellectual Property Office, the disclosures of which are incorporated herein in their entireties by reference.

BACKGROUND

Field

The present disclosure relates to an organic light-emitting display apparatus and a method of manufacturing the same.

Description of the Related Technology

Use of display apparatuses is rapidly expanding, and recently, there is a demand for a display apparatus that satisfies conditions including low power consumption, lightweight, slimness, and high-definition. In response to the demand, an organic light-emitting display apparatus using a liquid crystal display or an organic emission characteristic has been developed. An organic light-emitting display apparatus is a self-emissive display apparatus that is regarded as a next-generation display apparatus having excellent characteristics in terms of viewing angle, contrast ratio, response time, and power consumption, compared to a liquid crystal device (LCD), and has a light weight and a thin profile since the organic light-emitting display apparatus does not require a backlight. The organic light-emitting display apparatus generally includes a pixel electrode, an emission layer (EML), and an opposite electrode on a substrate, and when a voltage is applied between the pixel electrode and the opposite electrode, the EML emits lights. The organic light-emitting display apparatus includes a thin film transistor (TFT) for controlling the EML, a capacitor, and lines or electrodes that connect the TFT and the capacitor.

SUMMARY OF CERTAIN INVENTIVE ASPECTS

According to an aspect of the present invention, there is provided an organic light-emitting display apparatus including a substrate; a thin film transistor (TFT) on the substrate; a pixel-defining layer (PDL) disposed on the TFT, and comprising a first area having a first thickness and a second area having a second thickness greater than the first thickness, and a via hole in the first area; a pixel electrode disposed on at least a portion of the first area of the PDL, and electrically connected to the TFT via the via hole; an intermediate layer on the pixel electrode, the intermediate layer comprising an emission layer (EML); and an opposite electrode on the intermediate layer.

The PDL may include a third area formed between the first area and the second area and having a thickness greater than the first thickness and less than the second thickness.

The pixel electrode may be disposed on the first area and at least a portion of the third area.

The PDL may include a sloped area between the first area and the second area. The pixel electrode may be disposed on the first area, and at least a portion of the sloped area.

The pixel electrode may fill the via hole, and may be disposed on a portion of the first area.

The TFT may include an active layer, a gate electrode, a source electrode, and a drain electrode, a gate insulating layer disposed between the active layer and the gate electrode, and an interlayer insulating layer disposed between the gate electrode and each of the source electrode and the drain electrode. The pixel electrode may be electrically connected to at least one of the source electrode and the drain electrode.

The PDL may be directly disposed on the interlayer insulating layer and the source and drain electrodes.

The pixel electrode may include a first transparent conductive oxide layer, a metal layer on the first transparent conductive oxide layer, and a second transparent conductive oxide layer on the metal layer.

The opposite electrode may be disposed on the first area and the second area of the PDL, and the second area may directly contact the opposite electrode.

The first area and the via hole may be formed by using a halftone mask.

The organic light-emitting display apparatus may further include a thin film encapsulation layer on the opposite layer.

According to another aspect of the present invention, there is provided a method of manufacturing an organic light-emitting display apparatus, the method including operations of forming a thin film transistor (TFT) on a substrate; forming a pixel-defining layer (PDL) on the TFT, wherein the TFT comprises a first area having a first thickness and a second area having a second thickness greater than the first thickness, and a via hole in the first area; forming a pixel electrode on at least a portion of the first area, wherein the pixel electrode is electrically connected to the TFT via the via hole; forming an intermediate layer on the pixel electrode, the intermediate layer comprising an emission layer (EML); and forming an opposite electrode on the intermediate layer.

The PDL may further include a third area disposed between the first area and the second area and having a third thickness greater than the first thickness and less than the second thickness.

The pixel electrode may be formed on the first area and at least a portion of the third area of the PDL.

The PDL may be formed by using a halftone mask.

Forming the TFT may include forming an active layer on the substrate; forming a gate insulating layer on the active layer; forming a gate electrode on the gate insulating layer with the gate electrode overlapping with a portion of the active layer; forming a source region and a drain region on the active layer; forming an interlayer insulating layer on the gate electrode and the gate insulating layer, wherein the interlayer insulating layer includes contact holes at least partially exposing the source region and the drain region; and forming a source electrode and a drain electrode on the interlayer insulating layer, wherein the source electrode and the drain electrode are electrically connected to the source region and the drain region, respectively, via the contact holes.

BRIEF DESCRIPTION OF THE DRAWINGS

The above and other features and advantages of the present invention will become more apparent by describing in detail certain embodiments thereof with reference to the attached drawings in which.

DETAILED DESCRIPTION OF CERTAIN INVENTIVE EMBODIMENTS

Figure 1:
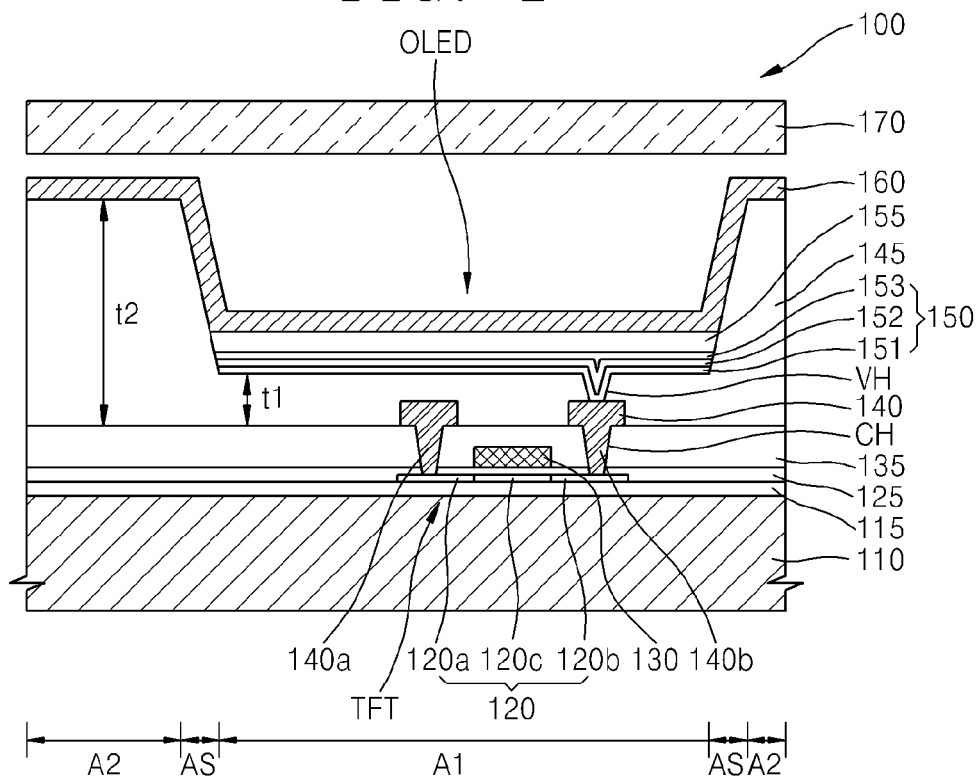
FIG. 1 is a cross-sectional view illustrating an organic light-emitting display apparatus according to an embodiment of the present invention.

The present invention will now be described more fully with reference to the accompanying drawings, in which certain embodiments of the invention are shown. The invention may, however, be embodied in many different forms, and should not be construed as being limited to the embodiments set forth herein. Thus, the invention may include all revisions, equivalents, or substitutions which are included in the concept and the technical scope related to the invention.

Like reference numerals in the drawings generally denote like elements. In the drawings, the dimension of structures may be exaggerated for clarity.

Furthermore, all examples and conditional language recited herein are to be construed as being without limitation to such specifically recited examples and conditions. Throughout the specification, a singular form may include plural forms, unless there is a particular description contrary thereto. Also, terms such as "comprise" or "comprising" are used to specify existence of a recited form, a number, a process, an operation, a component, and/or groups thereof, not excluding the existence of one or more other recited forms, one or more other numbers, one or more other processes, one or more other operations, one or more other components and/or groups thereof. As used herein, the term "and/or" includes any and all combinations of one or more of the associated listed items. Throughout the specification, while terms "first" and "second" are used to describe various components, it is obvious that the components are not limited to the terms "first" and "second". The terms "first" and "second" are used only to distinguish between each component. As used herein, it will also be understood that when a first feature is referred to as being "connected to", "combined with", or "interfaced with" a second feature, intervening third features may also be present. Also, throughout the specification, it will also be understood that when an element such as layer, region, or substrate is referred to as being "on", "connected to", or "coupled with" another element, it can be directly on the other element, or intervening elements may also be present. However, when an element is referred to as being "directly on", "directly connected to", or "directly coupled with" another element, it will be understood that there are no intervening elements.

Unless expressly described otherwise, all terms including descriptive or technical terms which are used herein should be construed as having meanings that are obvious to one of ordinary skill in the art. Also, terms that are defined in a general dictionary and that are used in the following description should be construed as having meanings that are equivalent to meanings used in the related description, and unless expressly described otherwise herein, the terms should not be construed as being ideal or excessively formal.

Expressions such as "at least one of," when preceding a list of elements, modify the entire list of elements and do not modify the individual elements of the list.

In order to form the TFT, the capacitor, and the lines of organic light-emitting display apparatus, a patterning process that generally mainly includes a photolithography process and an etching process is used. However, as the number of patterning processes increases, manufacturing costs are also increased. In this regard, in order to decrease the number of patterning processes, there is a provided structure in which a passivation layer or a planarization layer between a pixel electrode and a source drain or a drain electrode is omitted, and the pixel electrode is directly formed on the source drain or the drain electrode of the TFT. However, the provided structure has a problem that a lower electrode is damaged when the pixel electrode is patterned. In addition, the provided structure may have another problem that a harmful material, such as gas that is generated in a following process after formation of the TFT, may change a characteristic of the previously-formed TFT.

FIG. 1 is a cross-sectional view illustrating an organic light-emitting display apparatus 100 according to an embodiment of the present invention.

Referring to FIG. 1, the organic light-emitting display apparatus 100 includes a substrate 110, a thin film transistor (TFT) on the substrate 110, a pixel-defining layer (PDL) 145 on the TFT, a pixel electrode 150 on a portion of the PDL 145, an intermediate layer 155 on the pixel electrode 150, and an opposite electrode 160.

The substrate 110 may be formed of a transparent glass material containing $SiO_2$ as a main component. However, a material of the substrate 110 is not limited thereto, and the substrate 110 may be formed of a transparent plastic material and may have flexibility. The transparent plastic material that forms the substrate 110 may be formed of a single organic material or composition of a plurality of organic materials selected from various organic materials, and may further include an inorganic material.

If the organic light-emitting display apparatus 100 is a bottom emission-type organic light-emitting display device in which an image is realized toward the substrate 110, the substrate 110 has to be formed of a transparent material. However, if the organic light-emitting display apparatus 100 is a top emission-type organic light-emitting display device in which an image is realized away from the substrate 110, the substrate 110 may not be formed of a transparent material. In this case, the substrate 110 may be formed of metal. When the substrate 110 is formed of metal, the substrate 110 may include, but is not limited to, at least one of carbon, iron, chrome, manganese, nickel, titanium, molybdenum, and stainless using steel (SUS).

A display unit may be disposed on the substrate 110. Throughout the specification, the term 'display unit' refers to an organic light-emitting diode (OLED) and a TFT that drives the OLED, and means both a portion for displaying an image and another portion for driving the portion that displays the image.

When the display unit is viewed in a planar direction, pixels are matrix-arrayed. Each of the pixels includes an OLED and an electronic device that is electrically connected to the OLED. The electronic device may include at least two TFTs including a driving TFT and a switching TFT, a storage capacitor, and the like. The electronic device is electrically connected to lines via which the electronic device receives an electrical signal from a driving unit outside the display unit and then is driven. The aforementioned array including the electronic device that is electrically connected to the OLED, and the lines is referred to as a TFT array.

The display unit includes a device/line layer including the TFT array, and an OLED layer including an OLED array.

The device/line layer may include a driving TFT for driving the OLED, a switching TFT (not shown), a capacitor (not shown), and lines that are connected to the driving and switching TFTs or the capacitor. For convenience of description, FIG. 1 illustrates only the OLED and the driving TFT that drives the OLED. However, one or more embodiments of the present invention are not limited thereto, and a plurality of TFTs, storage capacitors, and various lines may be further included. Throughout the specification, the term 'TFT' structurally includes an active layer 120 on the substrate 110, a gate electrode 130, a source electrode 140a, a drain electrode 140b, a gate insulating layer 125 between the active layer 120 and the gate electrode 130, and an interlayer insulating layer 135 between the gate electrode 130 and each of the source electrode 140a and the drain electrode 140b.

The OLED layer may include the PDL 145, the pixel electrode 150 on the PDL 145, the intermediate layer 155 on the pixel electrode 150, and the opposite electrode 160.

A buffer layer 115 may be disposed on a top surface of the substrate 110 so as to allow planarization of the substrate 110 and to prevent penetration of substances into the substrate 110. The buffer layer 115 may include silicon oxide, silicon nitride, and/or silicon oxynitride. The buffer layer 115 may be deposited by using various methods including a plasma-enhanced chemical vapor deposition (PECVD) method, an atmospheric pressure CVD (APCVD) method, a low-pressure CVD (LPCVD) method, or the like. According to a type of the substrate 110, the buffer layer 115 may be omitted.

The active layer 120 may be disposed on a predetermined area of the buffer layer 115. The active layer 120 may be formed in a manner that an inorganic semiconductor, such as an oxide semiconductor, or an organic semiconductor is formed on an entire surface of the substrate 110 on the buffer layer 115, and then is patterned via a photolithography process and an etching process.

When the active layer 120 is formed of a silicon material, an amorphous silicon layer is formed on the entire surface of the substrate 110, the amorphous silicon layer is crystallized so that a polycrystalline silicon layer is formed, the polycrystalline silicon layer is patterned, and then side areas of the polycrystalline silicon layer are doped with impurity ions, so that the active layer 120 includes a source area 120a, a drain area 120b, and a channel area 120c between the source area 120a and the drain area 120b.

On the active layer 120, the gate insulating layer 125, including an insulating layer, such as silicon oxide, silicon nitride, and/or silicon oxynitride, may be formed.

The gate electrode 130 may be formed at a position that corresponds to the channel area 120c of the active layer 120. The gate electrode 130 may be connected to a gate line (not shown) to which a control signal is applied to control the TFT. Referring to FIG. 1, the gate electrode 130 has a single-layer structure. However, the gate electrode 130 may have a dual-layer structure including a first layer and a second layer. In this case, the first layer of the gate electrode 130 may include at least one of indium tin oxide (ITO), indium zinc oxide (IZO), zinc oxide (ZnO), indium oxide (In$_2$O$_3$), indium gallium oxide (IGO), and aluminum zinc oxide (AZO), and the second layer of the gate electrode 130 may include at least one of aluminum (Al), platinum (Pt), palladium (Pd), silver (Ag), magnesium (Mg), gold (Au), nickel (Ni), neodymium (Nd), iridium (Ir), chrome (Cr), lithium (Li), calcium (Ca), molybdenum (Mo), titanium (Ti), tungsten (W), copper (Cu), or an alloy thereof, and may have a single-layer structure or a multi-layer structure of molybdenum (Mo)/aluminum (Al)/molybdenum (Mo).

The interlayer insulating layer 135 may be disposed on the gate electrode 130. The interlayer insulating layer 135 may be formed of an organic insulating material selected from polyimide, polyamide, aryl resin, benzocyclobutane, and phenol resin, by using a spin coating method. The interlayer insulating layer 135 may have a thickness that is greater than the gate insulating layer 125. The interlayer insulating layer 135 may be formed of the aforementioned organic insulating material, similar to the gate insulating layer 125, may be formed of an inorganic insulating material, such as silicon oxide, silicon nitride, and/or silicon oxynitride, or may be formed by alternating the organic insulating material and the inorganic insulating material.

The gate insulating layer 125 and the interlayer insulating layer 135 may include contact holes CH that expose the source area 120a and the drain area 120b of the active layer 120, and in this regard, the source electrode 140a and the drain electrode 140b may be electrically connected to the source area 120a and the drain area 120b of the active layer 120 via the contact holes CH, respectively. The source electrode 140a and/or the drain electrode 140b may be connected to a source electrode and/or a drain electrode of another TFT or to an electrode of a capacitor via a line which is not shown in FIG. 1. The source electrode 140a, the drain electrode 140b, and lines may be simultaneously formed via one patterning process, and may be collectively referred as an electrode 140.

The electrode 140 may include the same material as the gate electrode 130. For example, the electrode 140 may include at least one of aluminum (Al), platinum (Pt), palladium (Pd), silver (Ag), magnesium (Mg), gold (Au), nickel (Ni), neodymium (Nd), iridium (Ir), chrome (Cr), nickel (Ni), calcium (Ca), molybdenum (Mo), titanium (Ti), tungsten (W), copper (Cu), or an alloy of any of these, and may have a single-layer structure or a multi-layer structure of molybdenum (Mo)/aluminum (Al)/molybdenum (Mo).

The PDL 145 may be disposed on the interlayer insulating layer 135 and the electrode 140. The PDL 145 may include a first area A1 having a first thickness t1 and a second area A2 having a second thickness t2. The first thickness t1 is less than the second thickness t2. A via hole VH is formed in the first area A1 of the PDL 145 so as to at least partially expose the electrode 140 below the PDL 145. As illustrated in FIG. 1, the via hole VH may at least partially expose the drain electrode 140b of the TFT. However, one or more embodiments of the present invention are not limited thereto. Thus, the via hole VH may at least partially expose the source electrode 140a, or may expose a portion of a line that is connected to the drain electrode 140b or the source electrode 140a. The PDL 145 that has areas with different thicknesses may be formed by using a halftone mask.

A sloped area AS may be formed between the first area A1 and the second area A2. As shown in FIG. 1, a thickness of the sloped area AS of the PDL 145 may stepwise increase from a portion adjacent to the first area A1 to a portion adjacent to the second area A2.

The PDL 145 may include an organic insulating layer. Examples of the organic insulating layer may include polymer derivatives having commercial polymers (PMMA and PS) and a phenol group, an acryl-based polymer, an imide-based polymer, an allyl ether-based polymer, an amidebased polymer, a fluorine-based polymer, a p-xylene-based polymer, a vinyl alcohol-based polymer, or a combination thereof. For example, the PDL 145 may include polyimide.

The OLED may be disposed on the first area A1 of the PDL 145. The OLED may include the pixel electrode 150 that is disposed on the first area A1 of the PDL 145, the opposite electrode 160 that faces the pixel electrode 150, and the intermediate layer 155 that is between the pixel electrode 150 and the opposite electrode 160. The second area A2 of the PDL 145 may surround the first area A1, and since the OLED is disposed on the first area A1, the first area A1 may be defined as an emission area. The second area A2 that surround the first area A1 projects, compared to the first area A, and since the OLED is not formed on the projecting second area A2, the second area A2 may be defined as a non-emission area.

The pixel electrode 150 may be electrically connected to the electrode 140 by filling the via hole VH of the PDL 145. As illustrated in FIG. 1, the pixel electrode 150 may be connected to the drain electrode 140b of the TFT. However, in another embodiment, the pixel electrode 150 may be connected to the source electrode 140a or another line. Referring to FIG. 1, the pixel electrode 150 completely covers the first area A1 of the PDL 145. However, in another embodiment, the pixel electrode 150 may cover only a portion of the first area A1 or may completely cover the first area A1 and even a portion of the sloped area AS.

In one embodiment, the PDL 145 may be directly disposed on the interlayer insulating layer 135 and the electrode 140, without including a planarization layer or a passivation layer therein, and by doing so, one patterning process may be skipped. As a result, manufacturing costs may be decreased. Also, since a portion of the PDL 145 is directly interposed between the pixel electrode 150 and the electrode 140, it is possible to prevent the electrode 140 from being damaged when the pixel electrode 150 is patterned.

When a voltage is applied between the pixel electrode 150 and the opposite electrode 160, the intermediate layer 155 may emit light. The intermediate layer 155 may emit blue light, green light, red light, or white light. When the intermediate layer 155 emits white light, the organic light-emitting display apparatus 100 may further include blue, green, and red color filters so as to express a color image.

The intermediate layer 155 may be disposed between the projecting areas due to the second area A2 of the PDL 145.

The organic light-emitting display apparatus 100 may be divided into a bottom-emission type organic light-emitting display apparatus, a top-emission type organic light-emitting display apparatus, and a dual-emission type organic light-emitting display apparatus. In a bottom-emission type organic light-emitting display apparatus, the pixel electrode 150 is formed as a transmissive electrode, and the opposite electrode 160 is formed as a reflective electrode. In a top-emission type organic light-emitting display apparatus, the pixel electrode 150 is formed as a reflective electrode, and the opposite electrode 160 is formed as a transflective electrode. In one embodiment, it is assumed that the organic light-emitting display apparatus 100 is a top-emission type organic light-emitting display apparatus in which the OLED emits light toward an encapsulation substrate 170.

The pixel electrode 150 may be a reflective electrode. The pixel electrode 150 may include a structure in which a reflective layer and a transparent or transflective electrode layer having a high work function are stacked. For example, the pixel electrode 150 may include a first transparent conductive oxide layer 151, a metal layer 152 on the first transparent conductive oxide layer 151, and a second transparent conductive oxide layer 153 on the metal layer 152. The first transparent conductive oxide layer 151 may be provided to increase adhesion between the pixel electrode 150 and the electrode 140. The metal layer 152 may function as a reflective layer, and the second transparent conductive oxide layer 153 may function as a transparent or transflective electrode layer.

The reflective layer may include silver (Ag), magnesium (Mg), aluminum (Al), platinum (Pt), palladium (Pd), gold (Au), nickel (Ni), neodymium (Nd), iridium (Ir), chrome (Cr), or an alloy thereof. The transparent or transflective electrode layer may include at least one transparent conductive oxide materials such as indium tin oxide (ITO), indium zinc oxide (IZO), zinc oxide (ZnO), indium oxide ($In_2O_3$), indium gallium oxide (IGO), aluminum zinc oxide (AZO), or the like. The pixel electrode 150 may be patterned in the form of an island that is separate in each pixel. Also, the pixel electrode 150 may function as an anode electrode.

The opposite electrode 160 may be formed as a transmissive electrode. The opposite electrode 160 may be a transflective layer that is thinly formed by using metal including lithium (Li), calcium (Ca), lithium fluoride (LiF)/calcium (Ca), lithium fluoride (LiF)/aluminum (Al), aluminum (Al), magnesium (Mg), silver (Ag), or the like. In order to compensate for a high resistance problem with respect to a thin metal transflective layer, a transparent conductive layer formed of transparent conductive oxide may be formed on the metal transflective layer. The opposite electrode 160 may be formed as a common electrode that extends over an entire surface of the substrate 110; for example, the opposite electrode 160 may directly cover the second area A2 of the PDL 145. Also, the opposite electrode 160 may function as a cathode electrode.

Polarities of the pixel electrode 150 and the opposite electrode 160 may be switched in different embodiments.

The intermediate layer 155 may include an emission layer (EML) that emits light, and the EML may be formed by using a small molecule organic material or a polymer organic material. When the EML is a small molecule organic layer formed of a small molecule organic material, a hole transport layer (HTL) and a hole injection layer (HIL) may be stacked below the EML toward the pixel electrode 150, and an electron transport layer (ETL) and an electron injection layer (EIL) may be stacked on the EML toward the opposite electrode 160. In addition to these layers, various layers, including an HIL, an HTL, an ETL, an EIL, or the like, may be stacked on or below the EML according to necessity.

The HIL may be formed of a phthalocyanine compound including copper phthalocyanine, or TCTA, m-MTDATA, m-MTDAPB, and the like, which are starburst-type amines. The HTL may be formed of N,N'-bis(3-methylphenyl)-N, N'-diphenyl-[1,1-biphenyl]-4,4'-diamine (TPD), N,N'-di (naphthalene-1-yl)-N,N'-diphenyl benzidine (α-NPD), or the like. The EIL may be formed of lithium fluoride (LiF), sodium chloride (NaCl), caesium fluoride (CsF), lithium oxide ($Li_2O$), barium oxide (BaO), or Liq. The ETL may be formed of aluminum tris(8-hydroxyquinoline) (Alq3). The intermediate layer 155 may include a host material and a dopant material.

When the EML is a polymer organic layer formed of a polymer organic material, only a polymer HTL may be stacked on the EML toward the pixel electrode 150. The polymer HTL is formed of poly(3,4-ethylenedioxythiophene) (PEDOT) or polyaniline (PANI) on the pixel electrode 150 by using an inkjet printing method or a spin coating method.

In the TFT of one embodiment, the gate electrode 130 is disposed on the active layer 120. However, one or more embodiments of the present invention are not limited thereto, and in another embodiment, the gate electrode 130 may be disposed below the active layer 120.

Since the OLED is formed of an organic material, the OLED may easily deteriorate due to exterior moisture or oxygen. Thus, the encapsulation substrate 170 may be disposed on the opposite electrode 160 so as to protect the OLED above the substrate 110.

The encapsulation substrate 170 may face the substrate 110. The substrate 110 and the encapsulation substrate 170 may be attached to each other by a sealing member (not shown) that is disposed along their edge. The encapsulation substrate 170 may be a glass substrate, a plastic substrate, or an SUS substrate.

Figure 2:
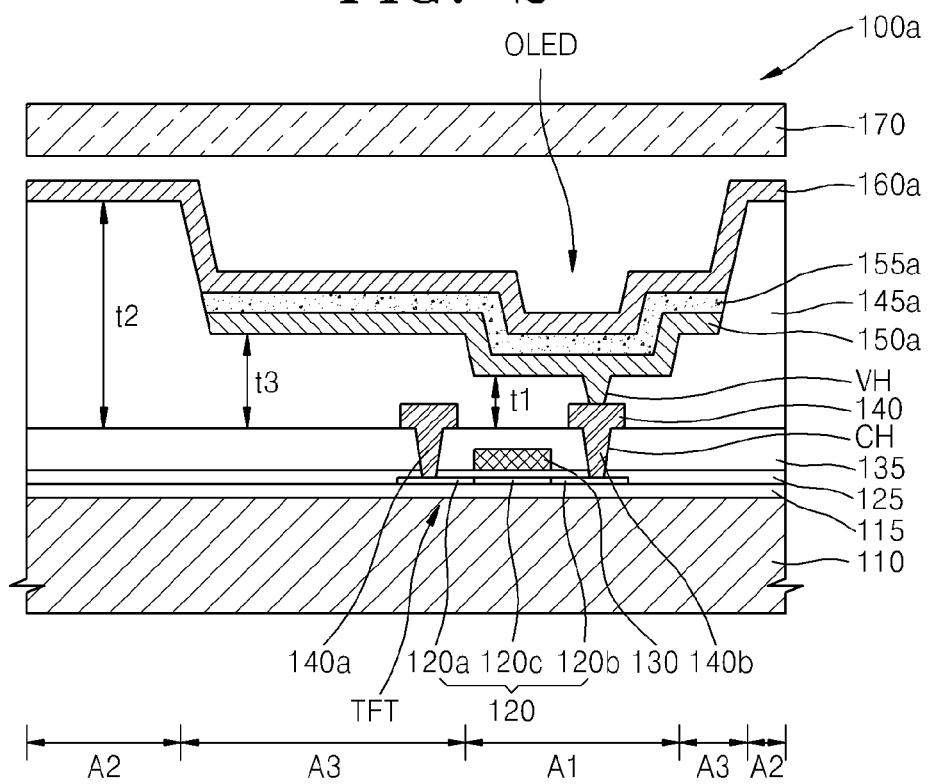
FIG. 2 is a cross-sectional view illustrating an organic light-emitting display apparatus according to another embodiment of the present invention.

FIG. 2 is a cross-sectional view illustrating an organic light-emitting display apparatus 100a according to another embodiment of the present invention.

Referring to FIG. 2, the organic light-emitting display apparatus 100a is similar to the organic light-emitting display apparatus 100 of FIG. 1, except for a cross-sectional shape of a PDL 145a and cross-sectional shapes of a pixel electrode 150a, an intermediate layer 155a, and an opposite electrode 160a that reflect the cross-sectional shape of the PDL 145a. The components that are the same have the same reference numeral regardless of the figure number, and repeated descriptions thereof are omitted.

The PDL 145a is disposed on the interlayer insulating layer 135 and the electrode 140. The PDL 145a includes a first area A1 having a first thickness t1 and second area A2 having a second thickness t2, similar to the PDL 145 of FIG. 1. The PDL 145a further includes a third area A3 having a third thickness t3 between the first area A1 and second area A2. The third thickness t3 is greater than the first thickness t1 and is less than the second thickness t2. Also, the first area A1 of the PDL 145a includes a via hole VH exposing a portion of the electrode 140.

Since the PDL 145a includes the third area A3 between the first area A1 the second area A2, the pixel electrode 150a, the intermediate layer 155a, and the opposite electrode 160a that are formed thereafter do not have sharp step differences. As a result, it is possible to solve a problem that the opposite electrode 160a is discontinuous at a side wall of the PDL 145a due to the sharp step difference.

In the embodiment of FIG. 2, the PDL 145a has the first, second, and third areas A1, A2, and A3. However, in order to further decrease a step difference between the first area A1 and the second area A2, more areas may be formed.

The PDL 145a may also be formed by using a halftone mask having various transmittances.

Referring to FIG. 2, the pixel electrode 150a covers the first area A1 and the third area A3, but it is not limited thereto. The pixel electrode 150a may cover the first area A1 and a portion of the third area A3. Also, the pixel electrode 150a may cover a portion of a sloped area between the third area A3 and the second area A2.

Figure 3:
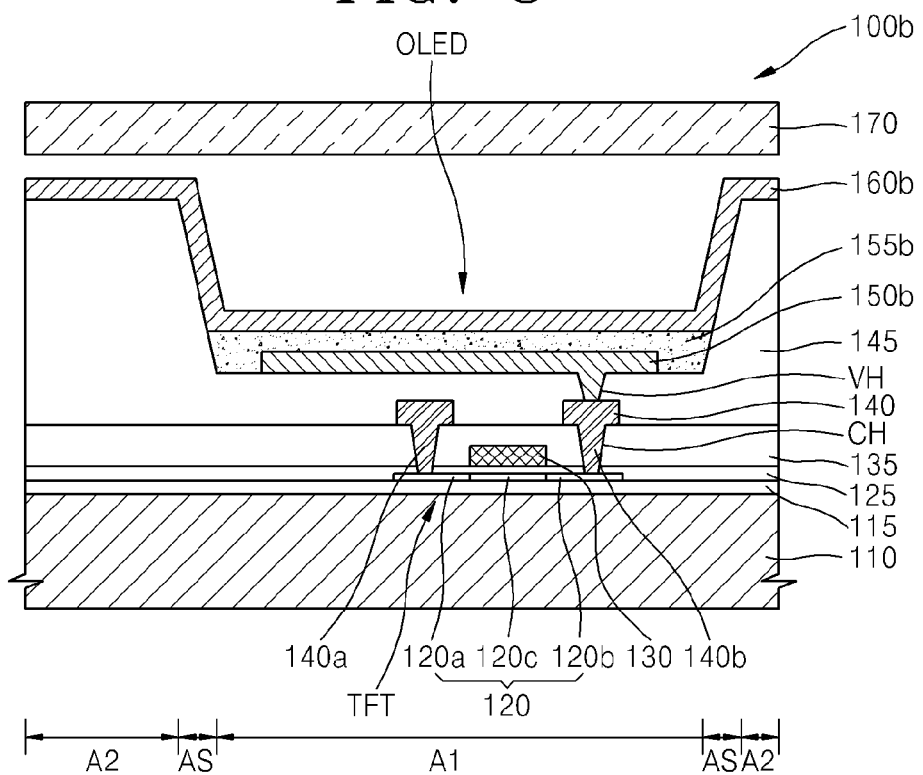
FIG. 3 is a cross-sectional view illustrating an organic light-emitting display apparatus according to another embodiment of the present invention.

FIG. 3 is a cross-sectional view illustrating an organic light-emitting display apparatus 100b according to another embodiment of the present invention.

Referring to FIG. 3, the organic light-emitting display apparatus 100b is similar to the organic light-emitting display apparatus 100 of FIG. 1, except for a cross-sectional shape of a pixel electrode 150b and cross-sectional shapes of an intermediate layer 155b and an opposite electrode 160b that reflect the cross-sectional shape of the pixel electrode 150b. The components that are the same have the same reference numeral regardless of the figure number, and repeated descriptions thereof are omitted.

The pixel electrode 150b is disposed on a portion of a first area A1 of a PDL 145. Since the pixel electrode 150b is disposed on the portion of the first area A1 that is planar, the pixel electrode 150b may be further exactly patterned. As a result, the emission by an EML may be exactly controlled.

The intermediate layer 155b may cover the pixel electrode 150b. The intermediate layer 155b may be formed on the first area A1 of the PDL 145 that is concavely defined by second area A2 of the PDL 145. However, the intermediate layer 155b is not limited thereto, and may be disposed only on the pixel electrode 150b or may cover a portion of a sloped area AS of the PDL 145.

The opposite electrode 160b may be formed on the intermediate layer 155b and an entire surface of the second area A2 of the PDL 145.

The pixel electrode 150b, the intermediate layer 155b, and the opposite electrode 160b in the embodiment of FIG. 3 may be equally applied to the embodiment of FIG. 2.

Figure 4:
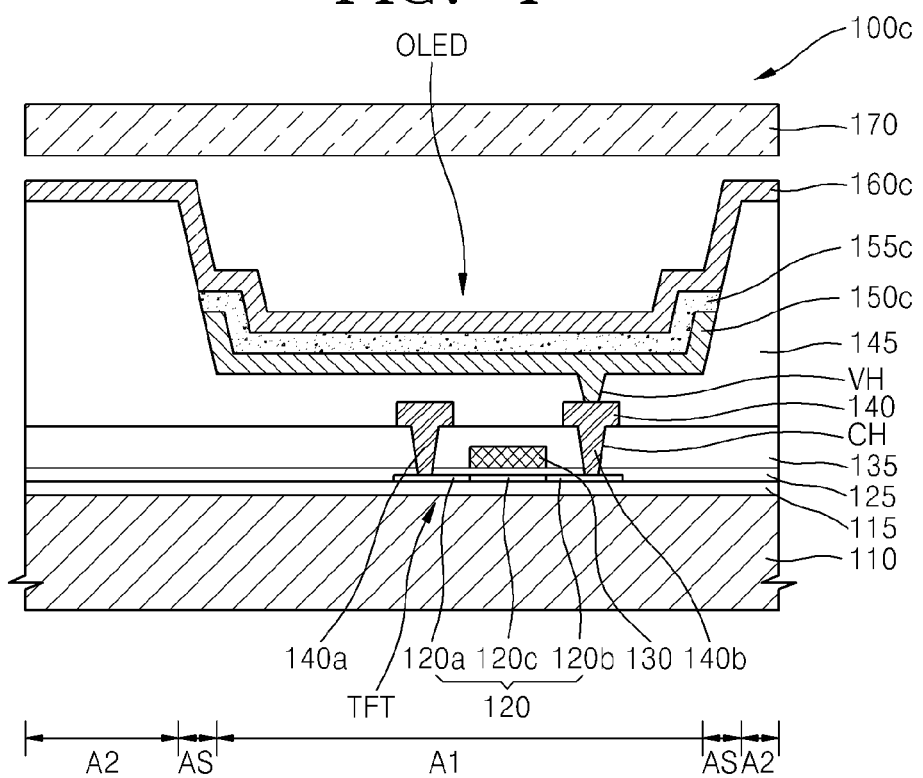
FIG. 4 is a cross-sectional view illustrating an organic light-emitting display apparatus according to another embodiment of the present invention.

FIG. 4 is a cross-sectional view illustrating an organic light-emitting display apparatus 100c according to another embodiment of the present invention.

Referring to FIG. 4, the organic light-emitting display apparatus 100c is similar to the organic light-emitting display apparatus 100 of FIG. 1, except for a cross-sectional shape of a pixel electrode 150c and cross-sectional shapes of an intermediate layer 155c and an opposite electrode 160c that reflect the cross-sectional shape of the pixel electrode 150c. The components that are the same have the same reference numeral regardless of the figure number, and repeated descriptions thereof are omitted.

The pixel electrode 150c is disposed not only on a first area A1 of a PDL 145 but is also formed on portions of left and right sloped areas AS. Since the pixel electrode 150c is also formed on the sloped areas AS, the organic light-emitting display apparatus 100c may provide a wider viewing angle. That is, when the organic light-emitting display apparatus 100c is a top-emission type organic light-emitting display apparatus, a left portion of the intermediate layer 155c on a left portion of the pixel electrode 150c that are formed on the left sloped area AS emit light toward a right side of the encapsulation substrate 170. When the organic light-emitting display apparatus 100c is a bottom-emission type organic light-emitting display apparatus, the left portion of the intermediate layer 155c emit light toward a left side of the substrate 110. Also, when the organic light-emitting display apparatus 100c is a top-emission type organic light-emitting display apparatus, a right portion of the intermediate layer 155c on a right portion of the pixel electrode 150c that are formed on the right sloped area AS emit light toward a left side of the encapsulation substrate 170. When the organic light-emitting display apparatus 100c is a bottom-emission type organic light-emitting display apparatus, the right portion of the intermediate layer 155c emit light toward a right side of the substrate 110. On the other hand, a planar portion of the intermediate layer 155c on the planar portion of the pixel electrode 150c that are formed on the first planar area A1 emits light toward a front surface or a bottom surface in a direction perpendicular to the substrate 110. Thus, an OLED may emit light in various directions by having a cross-section that is not planar but irregular, so that the organic light-emitting display apparatus 100c may provide a wider viewing angle.

The intermediate layer 155c is disposed not only on the first area A1 but also disposed on portions of the sloped areas AS so as to correspond to the cross-section of the pixel electrode 150c. The opposite electrode 160c may be disposed on an entire surface of the intermediate layer 155c and the second area A2 of the PDL 145.

The pixel electrode 150c, the intermediate layer 155c, and the opposite electrode 160c in the embodiment of FIG. 4 may be equally applied to the embodiment of FIG. 2.

Figure 5:
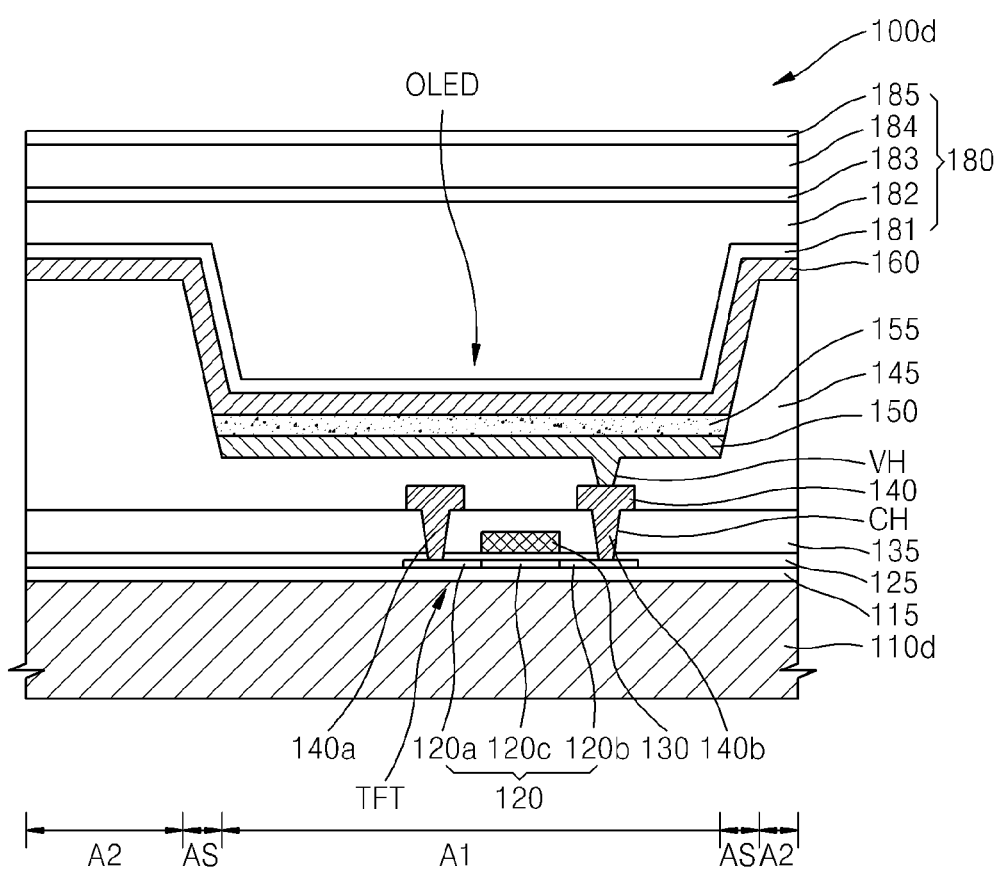
FIG. 5 is a cross-sectional view illustrating an organic light-emitting display apparatus according to another embodiment of the present invention.

FIG. 5 is a cross-sectional view illustrating an organic light-emitting display apparatus 100d according to another embodiment of the present invention.

Referring to FIG. 5, the organic light-emitting display apparatus 100d is illustrated. The organic light-emitting display apparatus 100d is materially the same as the organic light-emitting display apparatus 100 of FIG. 1, except for a substrate 110d and a thin film encapsulation layer 180. The components that are the same have the same reference numeral regardless of the figure number, and repeated descriptions thereof are omitted.

The substrate 110d may be a flexible substrate, and may be formed of a plastic material, such as polyimide (PI), polyethylene terephthalate (PET), polyethylene naphthalate (PEN), polycarbonate (PC), polyarylate (PAR), polyetherimide (PEI), polyethersulphone (PES), or the like, that has excellent heat-resistance and durability. However, one or more embodiments of the present invention are not limited thereto, and the substrate 110d may be formed by using various flexible materials, such as a metal foil or a thin glass. Similar to the substrate 110 of FIG. 1, the substrate 110d may be a rigid substrate, and in this case, the substrate 110d may be formed of a glass material.

The thin film encapsulation layer 180, instead of the encapsulation substrate 170 of FIG. 1, may be disposed on the opposite electrode 160. The thin film encapsulation layer 180 may be formed by alternately stacking one or more organic layers 182 and 184, and one or more inorganic layers 181, 183, and 185.

As illustrated in FIG. 5, a plurality of the inorganic layers 181, 183, and 185, and a plurality of the organic layers 182 and 184 may be formed. However, the present embodiment is not limited thereto, and the thin film encapsulation layer 180 may include only one organic layer or only one inorganic layer.

Each of the organic layers 182 and 184 may be formed of a polymer, and for example, may be a single layer or a stacked layer formed of any one of polyethylene terephthalate, polyimide, polycarbonate, epoxy, polyethylene, and polyacrylate. The organic layers 182 and 184 may be formed of polyacrylate, and may include a polymerized monomer composition including a diacrylate-based monomer and a triacrylate-based monomer. A monoacrylate-based monomer may be further included in the polymerized monomer composition. Also, the polymerized monomer composition may further include a well-known photoinitiator, such as TPO, but it is not limited thereto.

Each of the inorganic layers 181, 183, and 185 may be a single layer or stacked layer including a metal oxide or a metal nitride. For example, the inorganic layers 181, 183, and 185 may include at least one of SiNx, $Al_2O_3$, $SiO_2$, and $TiO_2$.

An uppermost layer of the thin film encapsulation layer 180, which is externally exposed, may be an inorganic layer in order to prevent water vapour transmission to the OLED. However, in some embodiments, the uppermost layer of the thin film encapsulation layer 180 may be an organic layer.

The thin film encapsulation layer 180 may include at least one sandwich structure, wherein at least one of the organic layers 182 and 184 is inserted between at least two of the inorganic layers 181, 183, and 185. Also, the thin film encapsulation layer 180 may include at least one sandwich structure, wherein at least one of the inorganic layers 181, 183, and 185 is inserted between the organic layers 182 and 184.

The thin film encapsulation layer 180 may include the inorganic layer 181, the organic layer 182, and the second inorganic layer 183 sequentially stacked from a top of the opposite electrode 160. Also, the thin film encapsulation layer 180 may include the first inorganic layer 181, the first organic layer 182, the second inorganic layer 183, the second organic layer 184, and the third inorganic layer 185 sequentially stacked from the top of the opposite electrode 160. Also, the thin film encapsulation layer 180 may include the first inorganic layer 181, the first organic layer 182, the second inorganic layer 183, the second organic layer 184, the third inorganic layer 185, a third organic layer (not shown), and a fourth inorganic layer (not shown) sequentially stacked from the top of the opposite electrode 160.

A halogenated metal layer, including, for example, LiF, may be further disposed between the opposite electrode 160 and the first inorganic layer 181. The halogenated metal layer may prevent the opposite electrode 160 and the OLED from being damaged while forming the first inorganic layer 181 via a sputtering method or a plasma deposition method.

Viewing the organic light-emitting display apparatus 100d in a planar direction, the first organic layer 182 may have a smaller area than the second inorganic layer 183, and the second organic layer 184 may have a smaller area than the third inorganic layer 185. Also, the first organic layer 182 may be completely covered by the second inorganic layer 183, and the second organic layer 184 may be completely covered by the third inorganic layer 185.

The organic light-emitting display apparatus 100d includes the substrate 110d having flexibility and the thin film encapsulation layer 180, so that the organic light-emitting display apparatus 100d may have flexibility. Thus, the organic light-emitting display apparatus 100d may be bent or rolled and may be mounted on products having a bent surface or products whose forms are changed.

The substrate 110d and the thin film encapsulation layer 180 in the embodiment of FIG. 5 may be equally applied to the embodiments of FIGS. 2 through 4.

FIGS. 6A through 6E are cross-sectional views that show processes of a method of manufacturing the organic light-emitting display apparatus 100 in order, according to an embodiment of the present invention.

Figure 6A:
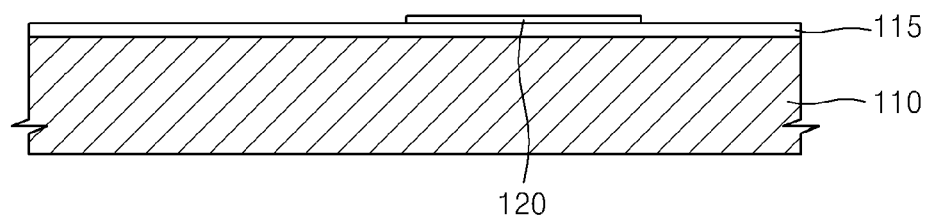
FIGS. 6A through 6E are cross-sectional views that show processes of a method of manufacturing the organic light-emitting display apparatus in order, according to an embodiment of the present invention.

Referring to FIG. 6A, the buffer layer 115 may be formed on the top surface of the substrate 110, and the active layer 120 may be formed on a predetermined area of the buffer layer 115. The substrate 110 may be formed of various materials including a transparent glass material, a transparent plastic material, a metal material, or the like.

The buffer layer 115, such as a barrier layer and/or a blocking layer, may be disposed to prevent impurity ions from diffusing into the substrate 110, to prevent penetration of moisture or outside air into the substrate 110, and to planarize the surface. The buffer layer 115 may be formed of an inorganic insulating material, such as silicon oxide, silicon nitride, and/or silicon oxynitride, by using various methods including a PECVD method, an APCVD method, an LPCVD method, or the like.

The active layer 120 of the TFT may be formed on a predetermined area of the buffer layer 115. In more detail, a semiconductor material layer (not shown), e.g., amorphous silicon, may be first deposited on the buffer layer 115 and then may be crystallized, so that a polysilicon layer (not shown) may be formed. The amorphous silicon may be crystallized by using various methods including a rapid thermal annealing (RTA) method, a solid phase crystallization (SPC) method, an excimer laser annealing (ELA) method, a metal-induced crystallization (MIC) method, a metal-induced lateral crystallization (MILC) method, a sequential lateral solidification (SLS) method, and the like. Then, the polysilicon layer may be patterned into the active layer 120, as shown in FIG. 6A, via a photolithographic process and an etching process that use a first mask (not shown).

In another embodiment, the polysilicon layer may be first patterned and then crystallized, so that the active layer 120, including polysilicon, may be formed.

Figure 6B:
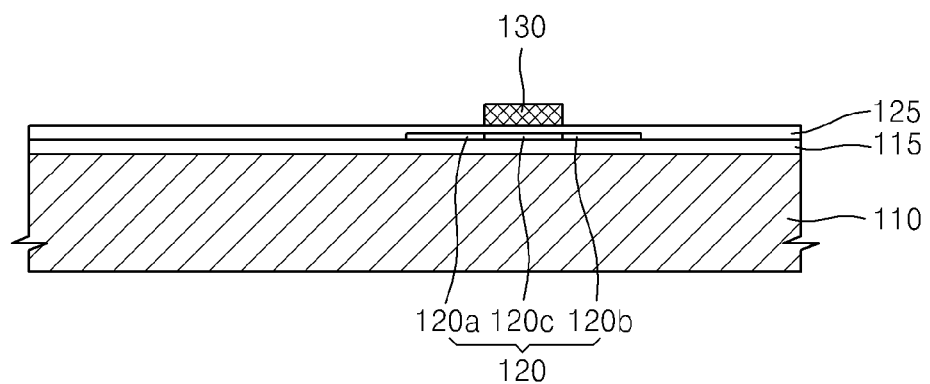

Referring to FIG. 6B, the gate insulating layer 125 may be formed on the active layer 120, and the gate electrode 130 may be formed at a position that corresponds to the channel area 120c of the active layer 120.

The gate insulating layer 125 may be formed by depositing an inorganic insulating layer, such as silicon nitride or silicon oxide, by using a PECVD method, an APCVD method, an LPCVD method, or the like. The gate insulating layer 125 may be interposed between the gate electrode 130 and the active layer 120 of the TFT, thereby functioning as a gate insulating layer of the TFT. Although not illustrated, a lower electrode formed from the same layer as the active layer 120, and an upper electrode formed from the same layer as the gate electrode 130 may configure a capacitor, and in this case, the gate insulating layer 125 may be interposed between the lower electrode and the upper electrode as a capacitor dielectric.

After a conductive material layer is formed on the gate insulating layer 125, the conductive material layer may be patterned via a photolithographic process and an etching process that use a second mask (not shown), so that the gate electrode 130 may be formed. The gate electrode 130 may include at least one of silver (Ag), magnesium (Mg), aluminum (Al), platinum (Pt), palladium (Pd), gold (Au), nickel (Ni), neodymium (Nd), iridium (Ir), chrome (Cr), lithium (Li), calcium (Ca), molybdenum (Mo), titanium (Ti), tungsten (W), copper (Cu), molybdenum tungsten (MoW), and aluminum/copper (Al/Cu). The gate electrode 130 may have a triple-layer structure including molybdenum (Mo)-aluminum (Al)-molybdenum (Mo). The gate electrode 130 may further include a transparent conductive material.

The source area 120a and the drain area 120b may be formed on portions of the active layer 120 by selectively injecting impurity into side portions of the active layer 120, by using the gate electrode 130 as a self-aligned mask. An area between the source area 120a and the drain area 120b of the active layer 120 may be defined as the channel area 120c. The impurity may include, for example, boron (B) ions or phosphorus (P) ions.

Figure 6C:
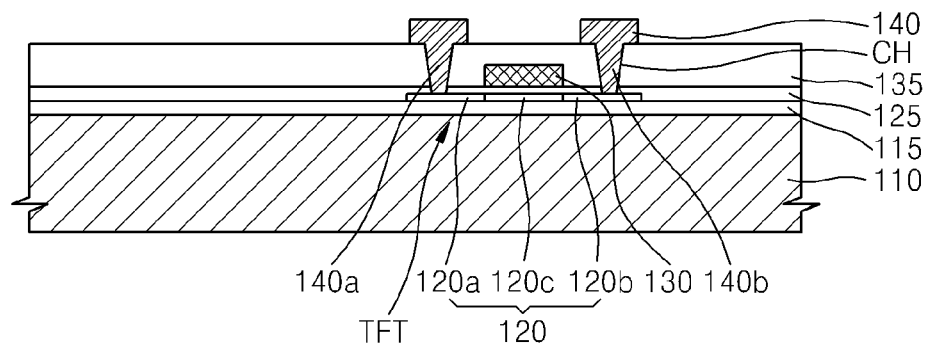

Referring to FIG. 6C, the interlayer insulating layer 135 is formed on the gate insulating layer 125 and the gate electrode 130, and the source electrode 140a and the drain electrode 140b that are connected to the source area 120a and the drain area 120b of the active layer 120, respectively, are formed.

The interlayer insulating layer 135 may be formed of an organic insulating material, similar to the gate insulating layer 125. The interlayer insulating layer 135 is interposed between the gate electrode 130 and the electrode 140, thereby functioning as an interlayer insulating layer. Although not illustrated, a lower electrode formed from the same layer as the gate electrode 130, and an upper electrode formed from the same layer as the electrode 140 may configure a capacitor, and in this case, the interlayer insulating layer 135 may be interposed between the lower electrode and the upper electrode as a capacitor dielectric.

The contact holes CH that expose a portion of the source region 120a and a portion of the drain region 120b may be formed in the interlayer insulating layer 135 via a photolithographic process and an etching process that use a third mask (not shown).

A conductive material layer may be filled in the contact holes CH and may be formed on the interlayer insulating layer 135. The conductive material layer may be patterned via a photolithographic process and an etching process that use a fourth mask (not shown), so that the electrode 140, including the source electrode 140a and the drain electrode 140b, may be formed. As described above, the electrode 140 may include source and drain electrodes of another TFT, and wiring, other than the source electrode 140a and the drain electrode 140b. Also, according to a structure of a capacitor, the electrode 140 may include an upper electrode of the capacitor. The electrode 140 may be formed of the same material as the gate electrode 130.

Figure 6D:
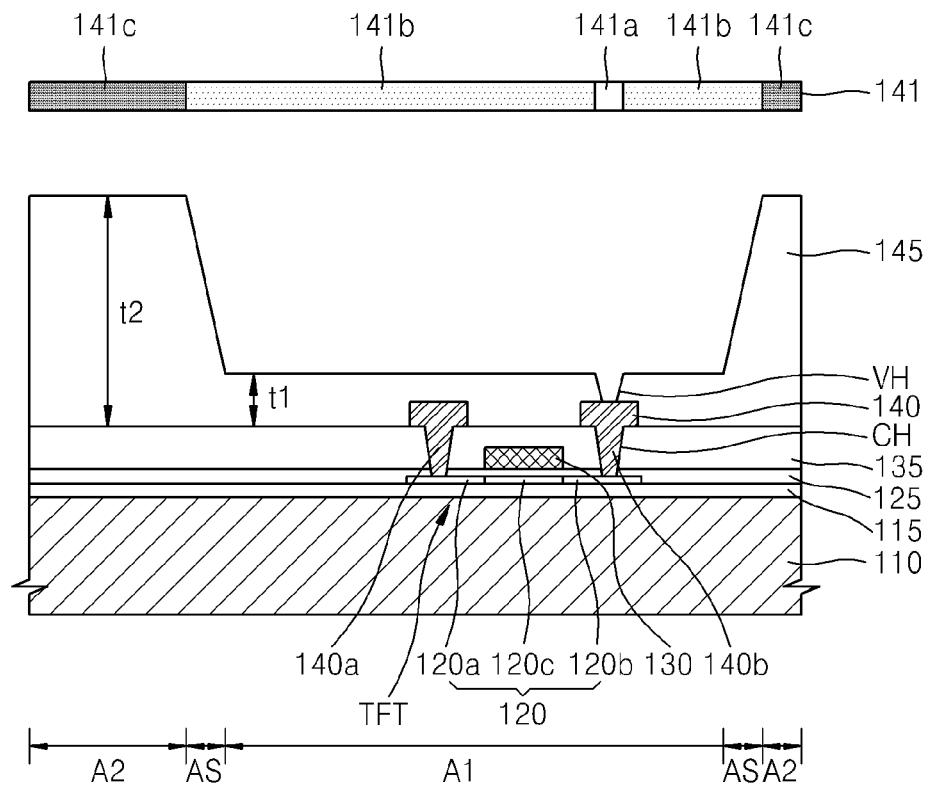

Referring to FIG. 6D, the PDL 145 may be formed on the interlayer insulating layer 135 and the electrode 140. As described above, the PDL 145 includes a first area A1 having a first thickness t1 and second area A2 having a second thickness t2, and the via hole VH is formed in the first area A1 so as to expose a portion of the electrode 140.

An organic material layer (not shown) may be formed on the interlayer insulating layer 135 and the electrode 140. The organic material layer may be formed of an organic insulating material selected from polyimide, polyamide, aryl resin, benzocyclobutane, and phenol resin, by using a spin coating method.

A photoresist layer (not shown) may be formed on the organic material layer. The photoresist layer may be exposed by a halftone mask 141. The halftone mask 141 may include a first region 141a that corresponds to the via hole VH, second regions 141b that correspond to the first area A1 excluding the via hole VH, and third regions 141c that correspond to the second area A2. For example, the first region 141a may completely transmit light, e.g., ultraviolet (UV) light that is used in an exposure, the second regions 141b may partially transmit light, and the third regions 141c may not transmit the light. According to a type of the photoresist layer, the first region 141a may not transmit the light, the second regions 141b may partially transmit light, and the third regions 141c may completely transmit light.

When the photoresist layer is developed after the exposure, the photoresist layer may have a form, which corresponds to the PDL 145, on the organic material layer. The organic material layer may be etched by using the photoresist layer as an etch mask. When the organic material layer is etched, the photoresist layer is also etched, so that the organic material layer that corresponds to the second regions 141b is exposed. Thus, the organic material layer that corresponds to the first region 141a may be completely removed, the organic material layer that corresponds to the second regions 141b may be partially removed, and the organic material layer that corresponds to the third regions 141c may not be removed. As a result, the PDL 145 having a step difference may be formed as shown in FIG. 6D.

As illustrated in FIG. 6D, the PDL 145 may include the first area A1 having the first thickness t1 and the second area A2 having the second thickness t2. Also, the PDL 145 may include the sloped areas AS that are formed between the first area A1 and the second area A2 due to a process reason.

Figure 6E:
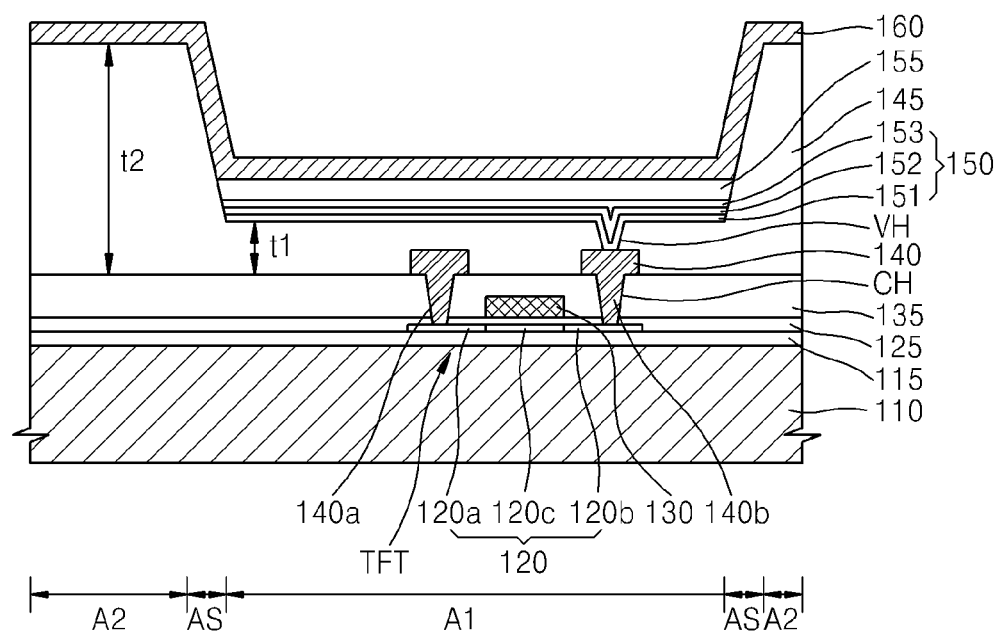

Referring to FIG. 6E, the pixel electrode 150 is formed on the first area A1 of the PDL 145, the intermediate layer 155, including the EML, is formed on the pixel electrode 150, and the opposite electrode 160 is formed on the intermediate layer 155 and the second areas A2 of the PDL 145.

The pixel electrode 150 fills the via hole VH of the PDL 145 and is formed on the first area A1. A pixel electrode material layer (not shown) may be formed on the PDL 145 so as to fill the via hole VH and then may be patterned via a photolithographic process and an etching process that use a fifth mask (not shown), so that the pixel electrode 150 may be formed on the first area A1. As illustrated in FIG. 6E, the pixel electrode 150 may have a stack structure in which a plurality of layers are stacked. For example, the pixel electrode 150 may include the first transparent conductive oxide layer 151, the metal layer 152, and the second transparent conductive oxide layer 153.

The intermediate layer 155, including the EML, may be formed on the pixel electrode 150 by using an inkjet printing method, a spin coating method, or a laser-induced thermal imaging (LITI) method The opposite electrode 160 may be deposited on an entire surface of the substrate 100.

Afterward, the encapsulation substrate 170 shown in FIG. 1 may be attached on the substrate 110 by using a sealing member (not shown). In another embodiment, the thin film encapsulation layer 180 shown in FIG. 5 may be formed on the opposite electrode 160. In this case, an inorganic layer and an organic layer may be alternately formed on the opposite electrode 160.

According to the organic light-emitting display apparatus and the method of manufacturing the same, according to one or more embodiments of the present invention, the PDL that defines a pixel may be formed before the pixel electrode is formed, and then the pixel electrode may be formed on a concave portion of the PDL, so that the PDL may also function as a passivation layer. As a result, although the pixel electrode is patterned, a lower electrode is not damaged, and a TFT in the pixel electrode may be protected from an external harmful environment.

For convenience of description, drawings related to the one or more embodiments illustrate only one TFT. However, the number of TFTs is not limited thereto, and one or more embodiments may include a plurality of TFTs and a plurality of capacitors.

While the present invention has been particularly shown and described with reference to certain embodiments thereof, it will be understood by those of ordinary skill in the art that various changes in form and details may be made therein without departing from the spirit and scope of the present invention as defined by the following claims.

What is claimed is:

1. An organic light-emitting display apparatus comprising:
    a substrate;
    a thin film transistor (TFT) on the substrate;
    a pixel-defining layer (PDL) disposed on the TFT, and being a single layer comprising a first area having a first thickness and a second area having a second thickness greater than the first thickness, and a via hole in the first area;
    a pixel electrode disposed on at least a portion of the first area of the PDL, and electrically connected to the TFT via the via hole;
    an intermediate layer on the pixel electrode, the intermediate layer comprising an emission layer (EML); and
    an opposite electrode on the intermediate layer and the second area of the PDL, wherein the opposite electrode contacts the second area of the PDL.

2. The organic light-emitting display apparatus of claim 1, wherein the PDL exposes a edge of a top surface of the pixel electrode.

3. The organic light-emitting display apparatus of claim 2, wherein the PDL comprises a third area formed between the first area and the second area, the third area having a thickness greater than the first thickness and less than the second thickness.

4. The organic light-emitting display apparatus of claim 3, wherein the pixel electrode is disposed on the first area and at least a portion of the third area.

5. The organic light-emitting display apparatus of claim 1, wherein the PDL comprises a sloped area between the first area and the second area, and the pixel electrode is disposed on the first area and at least a portion of the sloped area.

6. The organic light-emitting display apparatus of claim 1, wherein the pixel electrode fills the via hole, and is disposed on a portion of the first area.

7. The organic light-emitting display apparatus of claim 1, wherein the TFT comprises an active layer, a gate electrode, a source electrode, and a drain electrode, a gate insulating layer disposed between the active layer and the gate electrode, and an interlayer insulating layer disposed between the gate electrode and each of the source electrode and the drain electrode, and the pixel electrode is electrically connected to at least one of the source electrode and the drain electrode.

8. The organic light-emitting display apparatus of claim 7, wherein the PDL is directly disposed on the interlayer insulating layer and the source and drain electrodes.

9. The organic light-emitting display apparatus of claim 1, wherein the pixel electrode includes a first transparent conductive oxide layer, a metal layer on the first transparent conductive oxide layer, and a second transparent conductive oxide layer on the metal layer.

10. The organic light-emitting display apparatus of claim 1, wherein the opposite electrode is disposed on the first area and the second area, and the second area, and directly contacts the second area of the PDL.

11. The organic light-emitting display apparatus of claim 1, wherein the first area and the via hole are formed by using a halftone mask.

12. The organic light-emitting display apparatus of claim 1, further comprising a thin film encapsulation layer on the opposite layer.

13. A method of manufacturing an organic light-emitting display apparatus, the method comprising:
    forming a thin film transistor (TFT) on a substrate;
    forming a pixel-defining layer (PDL) on the TFT, wherein the PDL is a single layer comprising a first area having a first thickness and a second area having a second thickness greater than the first thickness, and a via hole in the first area;
    forming a pixel electrode on at least a portion of the first area, wherein the pixel electrode is electrically connected to the TFT via the via hole;
    forming an intermediate layer on the pixel electrode, the intermediate layer comprising an emission layer (EML); and
    forming an opposite electrode on the intermediate layer and the second area of the PDL, wherein the opposite electrode contacts the second area of the PDL.

14. The method of claim 13, wherein the pixel electrode is formed after the PDL having the first and second areas is formed.

15. The method of claim 13, wherein the PDL exposes a edge of a top surface of the pixel electrode.

16. The method of claim 15, wherein forming the PDL comprises forming the PDL on the TFT, wherein the PDL further comprises a third area disposed between the first area and the second area having a third thickness greater than the first thickness and less than the second thickness.

17. The method of claim 16, wherein forming the pixel electrode comprises forming the pixel electrode on the first area and at least a portion of the third area.

18. The method of claim 13, wherein forming the PDL comprises forming the PDL by using a halftone mask.

19. The method of claim 13, wherein forming the TFT comprises:
- forming an active layer on the substrate;
- forming a gate insulating layer on the active layer;
- forming a gate electrode on the gate insulating layer with the gate electrode overlapping with a portion of the active layer;
- forming a source region and a drain region on the active layer;
- forming an interlayer insulating layer on the gate electrode and the gate insulating layer, wherein the interlayer insulating layer comprises contact holes at least partially exposing the source region and the drain region; and
- forming a source electrode and a drain electrode on the interlayer insulating layer, wherein the source electrode and the drain electrode are electrically connected to the source region and the drain region, respectively, via the contact holes.

20. The method of claim 13, wherein the opposite electrode directly contacts the second area of the PDL.

* * * * *